US012602318B2

(12) United States Patent
Sun et al.

(10) Patent No.: US 12,602,318 B2
(45) Date of Patent: Apr. 14, 2026

(54) MEMORY CONTROL SYSTEM AND METHOD

(71) Applicant: CRM ICBG (WUXI) CO., LTD., Wuxi (CN)

(72) Inventors: Jun Sun, Wuxi (CN); Chun Hua, Wuxi (CN); Tianping Shen, Wuxi (CN); Lili Jiang, Wuxi (CN)

(73) Assignee: CRM ICBG (WUXI) CO., LTD., Wuxi (CN)

( * ) Notice: Subject to any disclaimer, the term of this patent is extended or adjusted under 35 U.S.C. 154(b) by 0 days.

(21) Appl. No.: 18/718,843

(22) PCT Filed: Mar. 7, 2023

(86) PCT No.: PCT/CN2023/080097
§ 371 (c)(1),
(2) Date: Jun. 12, 2024

(87) PCT Pub. No.: WO2023/169420
PCT Pub. Date: Sep. 14, 2023

(65) Prior Publication Data
US 2025/0053508 A1 Feb. 13, 2025

(30) Foreign Application Priority Data
Mar. 9, 2022 (CN) .......................... 202210225720.2

(51) Int. Cl.
G06F 12/00 (2006.01)
G06F 12/02 (2006.01)
G11C 29/38 (2006.01)

(52) U.S. Cl.
CPC .......... G06F 12/0246 (2013.01); G11C 29/38 (2013.01)

(58) Field of Classification Search
CPC ....... G06F 12/0246; G11C 29/38; G11C 7/10; G11C 16/04; G11C 16/10; G11C 16/26;
(Continued)

(56) References Cited

U.S. PATENT DOCUMENTS 5,465,209 A * 11/1995 Sammut ............. B60G 17/0155
701/37
5,943,092 A * 8/1999 Chuang .................. H04N 17/04
348/E17.005
(Continued)

FOREIGN PATENT DOCUMENTS

CN 112242176 A 1/2021
CN 112259150 A 1/2021
(Continued)

OTHER PUBLICATIONS

For Reference Cited.*
(Continued)

*Primary Examiner* — Mardochee Chery
(74) *Attorney, Agent, or Firm* — Dority & Manning, PA

(57) ABSTRACT

A memory control system includes: a memory having a main storage module and a built-in EEPROM; a storage controller which, in a normal mode, reads a program in the main storage module on the basis of an instruction of a processor and performs read-write control on the built-in EEPROM, and in a test mode, performs read-write control on the main storage module or the built-in EEPROM on the basis of configuration of a test control signal, or completes a self-test on the basis of an instruction of the test control signal; and the processor. According to the present disclosure, resource consumption is greatly reduced; logic of a hardware control reading part after dormancy is omitted and the time consumed during dormancy and wake-up is reduced; and only (Continued)

one counter and one time sequence control unit are used to implement control of the time sequence of the whole system.

11 Claims, 8 Drawing Sheets

(58) Field of Classification Search
CPC ......... G11C 16/34; G11C 29/16; G11C 29/46; G11C 16/0433; G11C 7/1006; G11C 7/1036; G11C 7/1045
USPC ........................................................ 711/103
See application file for complete search history.

(56)                        References Cited

U.S. PATENT DOCUMENTS

| | | | |
|---|---|---|---|
| 2003/0037295 A1 | 2/2003 | Galzur et al. | |
| 2015/0316605 A1 | 11/2015 | Deutsch et al. | |

FOREIGN PATENT DOCUMENTS

| | | | | | |
|---|---|---|---|---|---|
| CN | 112614535 A | * | 4/2021 | ............. | G11C 29/50 |
| KR | 20000039916 A | * | 7/2000 | ............. | H04W 24/06 |

OTHER PUBLICATIONS

International Search Report and Written Opinion (with English translation) received in corresponding Application No. PCT/CN2023/080097 dated May 26, 2023, 11 pages.

* cited by examiner

MEMORY CONTROL SYSTEM AND METHOD

CROSS-REFERENCE TO RELATED APPLICATIONS

This application is a national stage of PCT Patent Application No. PCT/CN2023/080097, entitled "MEMORY CONTROL SYSTEM AND METHOD", filed on Mar. 7, 2023; which claims priority to Chinese Patent Application No. 202210225720.2, entitled "MEMORY CONTROL SYSTEM AND METHOD" and filed with the China Patent Office on Mar. 9, 2022, the entire contents of which are incorporated herein by reference.

TECHNICAL FIELD

The present disclosure relates to the field of memories, and in particular, to a memory control system and method.

BACKGROUND

Storage architecture of current processors generally uses a program memory+a separate EEPROM. The storage architecture mainly has the following three problems during a digital design.

1. The architecture uses a separate program memory and an EEPROM, leading to a higher cost.
2. The architecture requires separate controller designs for the program memory and the EEPROM, resulting in an increase in a chip area.
3. The architecture results in an increase in a number of logic gates after the separate controller designs for the program memory and the EEPROM, leading to increased power consumption.

Therefore, how to simplify memory architecture and control logic of the processor to reduce the cost, the chip area, and the power consumption has become one of the urgent problems to be solved by those skilled in the art.

SUMMARY

In view of the above shortcomings of the prior art, an objective of the present disclosure is to provide a memory control system and method to solve the problems of a high cost, a large chip area, and high power consumption in the prior art.

To achieve the above objective and other related objectives, the present disclosure provides a memory control system, wherein the memory control system includes at least:

a memory, a storage controller, and a processor;

the memory including a main storage module and a built-in EEPROM; and the storage controller being connected to the memory and the processor and receiving a test control signal; in a normal mode, reading a program in the main storage module on the basis of an instruction of the processor and performing read-write control on the built-in EEPROM; and in a test mode, performing read-write control on the main storage module or the built-in EEPROM on the basis of configuration of the test control signal, or completing a self-test on the basis of an instruction of the test control signal.

Optionally, the storage controller includes a control register bank, a state machine, a time sequence control unit, a data address processing unit, and a built-in self-test control unit;

the built-in self-test control unit receiving the test control signal and generating a self-test configuration signal;

the control register bank acquiring configuration instructions from the processor, the built-in self-test control unit, and the test control signal, and receiving, registering, and parsing the configuration instructions;

the state machine being connected to the control register bank and controlling transition of an operating state on the basis of an output signal of the control register bank;

the time sequence control unit being connected to the state machine and the memory and generating, on the basis of an operating state determined by the state machine, a time sequence control signal satisfying operation of the memory; and the data address processing unit being connected to the state machine, the control register bank, and the memory, controlling an operating address of the memory on the basis of the state machine and the control register bank, and processing data read from or written to the memory.

More optionally, the time sequence control unit includes a time sequence information array and a counter; the time sequence information array including count target values corresponding to operating states, count values corresponding to rising edges of timing signals, and count values corresponding to falling edges; the counter counting the operating states on the basis of the time sequence information array, and being reset after the count target values corresponding to the operating states are reached.

More optionally, the storage controller further includes a trim register bank, the trim register bank being connected to an output terminal of the data address processing unit, reading a trim value in the memory at power on, and registering and parsing the trim value.

More optionally, the state machine is in the idle state by default, switches to the trim value read state after completion of power on, and returns to the idle state after completion of readout; after receiving a read instruction from the main storage module, the state machine switches from the idle state to the main storage module read state, and returns to the idle state after completion of readout; after receiving a read instruction from the built-in EEPROM, the state machine switches from the idle state to the built-in EEPROM read state, and returns to the idle state after completion of readout; after receiving a write instruction from the main storage module, the state machine switches from the idle state to the main storage module erase state, switches to the main storage module write state after completion of erasure, and returns to the idle state after completion of writing; and after receiving a write instruction from the built-in EEPROM, the state machine switches from the idle state to the built-in EEPROM erase state, switches to the built-in EEPROM write state after completion of erasure, and returns to the idle state after completion of writing.

Optionally, the processor is a central processing unit (CPU) or a micro control unit (MCU).

More optionally, the memory control system further includes an I2C slave and a test mode controller; the I2C slave receiving an external I2C signal; and the test mode controller being connected to the I2C slave, setting the test mode on the basis of an output signal of the I2C slave, and outputting the test control signal.

To achieve the above objective and other related objectives, the present disclosure provides a memory control method implemented on the basis of the above memory control system, wherein the memory control method includes at least:

in a normal mode, a storage controller reading a program in a main storage module on the basis of an instruction of a processor and performing read and write operations on a built-in EEPROM; and in a test mode, the storage controller performing read and write operations on the main storage module or the built-in EEPROM on the basis of configuration of a test control signal; or completing a self-test on the basis of an instruction of the test control signal.

Optionally, when the write operation is performed on the built-in EEPROM in the normal mode, the processor executes the program and enters a dormant state after configuration of a control register bank, and writes data to the built-in EEPROM, and after completion of the write operation, the processor is woken up and continues to execute the program; and when the read operation is performed on the built-in EEPROM in the normal mode, the processor executes a read operation program during the entire reading, and data is read from the built-in EEPROM and reported to the processor.

More optionally, the memory control method further includes: reading a trim value in the main storage module after power on, entering a window period to wait after completion of reading of the trim value, and determining in the window period whether to operate in the normal mode or the test mode.

As described above, the memory control system and method in the present disclosure have the following beneficial effects.

1. In the memory control system and method according to the present disclosure, when read and write operations are performed on the EEPROM, a random access memory (RAM) is eliminated and replaced with a small number of registers, which greatly reduces resource consumption.

2. In the memory control system and method according to the present disclosure, when the read operation is performed on the EEPROM, data of the EEPROM is directly acquired through the processor, and dormancy and wake-up operations are not required. Therefore, logic of a hardware control reading part after dormancy is omitted and the time consumed during dormancy and wake-up is reduced, the process is simple and convenient, and the efficiency is high.

3. In the memory control system and method according to the present disclosure, only one time sequence control unit and one counter are used to implement control of the timing of the whole system, thereby effectively reducing the size and power consumption of the whole system.

REFERENCE SIGNS

11: Memory
    111: Main storage module
    112: Built-in EEPROM
    12: Selector
    13: Storage controller
    14: CPU
    15: RAM
    16: RAM controller
    17: Built-in self-test controller
    18: Test mode controller
    19: I2C slave
    2: Memory control system
    21: Memory
    211: Main storage module
    212: Built-in EEPROM
    22: Storage controller
    221: Control register bank
    222: State machine
    223: Time sequence control unit
    224: Data address processing unit
    225: Built-in self-test control unit
    226: Trim register bank
    23: Processor
    24: I2C slave
    25: Test mode controller
    26: To-be-trimmed module

DETAILED DESCRIPTION

Implementations of the present disclosure are described below through specific examples. Those skilled in the art can easily understand other advantages and effects of the present disclosure from the content disclosed in this specification. The present disclosure may also be implemented or applied through other different specific implementations. Various details in this specification may also be modified or changed in various manners based on different viewpoints and applications without departing from the spirit of the present disclosure.

Refer to FIG. 1 to FIG. 8. It is to be noted that the diagrams provided in the following embodiments merely schematically illustrate the basic concept of the present disclosure, and only the components related to the present disclosure are shown in the diagrams, so that the diagrams are not drawn in accordance with the number, shape and size of the components in actual implementations. The type, the number and the proportion of the components in the actual implementations can be arbitrarily changed, and layouts of the components may be more complex.

Figure 1:
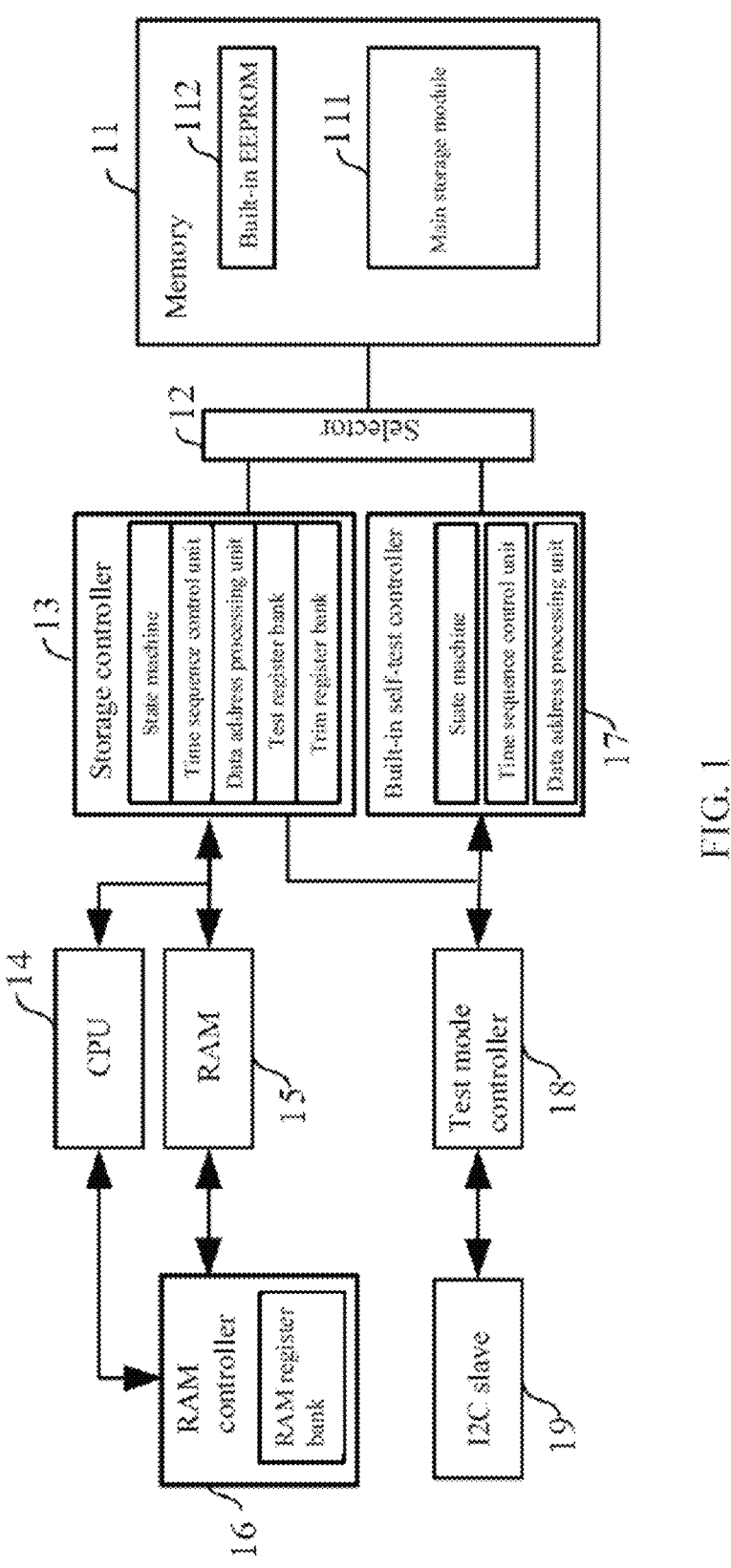
FIG. 1 is a schematic architectural diagram of a memory with a built-in EEPROM.

As shown in FIG. 1, a solution of a memory with a built-in EEPROM is proposed, including a memory 11, a selector 12, a storage controller 13, a CPU 14, a RAM 15, a RAM controller 16, a built-in self-test controller 17, a test mode controller 18, and an I2C slave 19. The memory 11 includes a main storage module 111 and a built-in EEPROM 112. The storage controller 13 include a state machine, a time sequence control unit, a data address processing unit, a test register bank, and a trim register bank. The RAM controller 16 includes a RAM register bank. The built-in self-test controller 17 includes a state machine, a time sequence control unit, and a data address processing unit. Functions implemented by the solution include: power-on trim value reading in a normal mode, reading of a program insider the memory by the CPU in the normal mode, read and write operations on the EEPROM in the normal mode, read and write operations on the memory in the test mode, writing and reading of multiple programming (MTP) by an I2C in the test mode, writing and reading of the EEPROM by the I2C in the test mode, and a built-in self-test of the memory in the test mode.

The power-on trim value reading in the normal mode means that after power on, the storage controller 13 controls timing, performs a read operation on a trim value stored at a fixed address in the memory 11, and then stores the read trim value in the internal trim register bank and reports the trim value to other modules.

The reading of the program inside the memory by the CPU in the normal mode means that the storage controller 13 sends read timing to the memory 11 according to an address specified by the CPU 14 and reports the read data to the CPU 14.

The read and write operations on the EEPROM in the normal mode means that completion indirectly by the RAM 15 is required because the main storage module 111 and the built-in EEPROM 112 cannot be operated at the same time. The writing of the EEPROM involves the following specific operation steps: first writing data to the RAM 15 and configuring the RAM register bank for the write operation on the EEPROM; then configuring the CPU 14 to enter the dormant state to prevent the CPU 14 from continuing to read data in a MTP program region; and finally, after the CPU 14 is dormant, hardware automatically switching to select an EEPROM region and mapping the data in the RAM 15 to the EEPROM 112, and after completion, automatically waking up the CPU 14 to continue to execute the program. The reading of the EEPROM involves the following specific operation steps: first configuring the RAM register bank for the read operation on the EEPROM; then configuring the CPU 14 to enter the dormant state to prevent the CPU 14 from continuing to read data in the MTP program region; and finally, after the CPU 14 is dormant, the hardware automatically switching to select the EEPROM region and mapping the data in the EEPROM 112 to the RAM 15, after completion, automatically waking up the CPU 14 to continue to execute the program, and a user indirectly reading the data of the EEPROM by reading the RAM 15.

The read and write operations on the memory in the test mode means that an external I2C host sends an instruction, and the internal I2C slave 19 parses the received instruction and enters a corresponding mode, and completes configuration of the test register bank in the storage controller 13, so that the storage controller 13 generates read and write timing to control the memory 11.

The built-in self-test of the memory in the test mode means that the external I2C host sends an instruction, and the internal I2C slave 19 parses the received instruction and enters a corresponding mode, enables the built-in self-test controller 17, generates a timing signal, makes a selection through the selector 12, and takes over the memory 11, completing a self-test of the entire memory 11.

As can be seen, when the EEPROM is operated, interaction through the RAM 15 is required, which consumes a lot of resources. When the read or write operation is performed on the EEPROM, dormancy and wake-up operations on the CPU 14 are required, so the process is complex and the efficiency is low. Both the storage controller 13 and the built-in self-test controller 17 include time sequence control units, and the use of excessive time sequence control units, that is, the use of a large number of counters, may lead to an increase in the size and power consumption. On the basis of the above reasons, the present disclosure proposes a new memory control system to solve the above problems. A specific solution is as follows.

Figure 2:
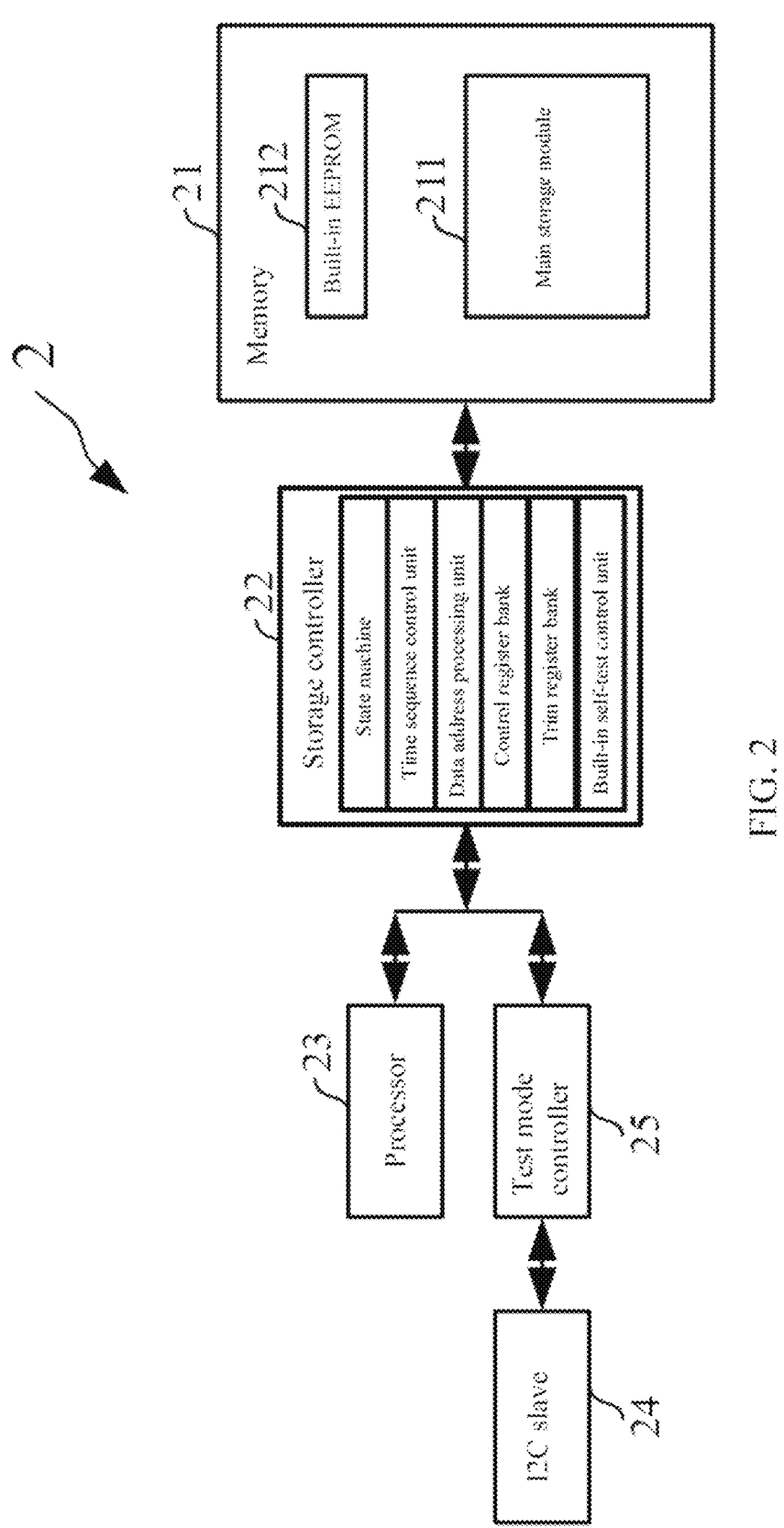
FIG. 2 is a schematic architectural diagram of a memory control system according to the present disclosure.
Figure 3:
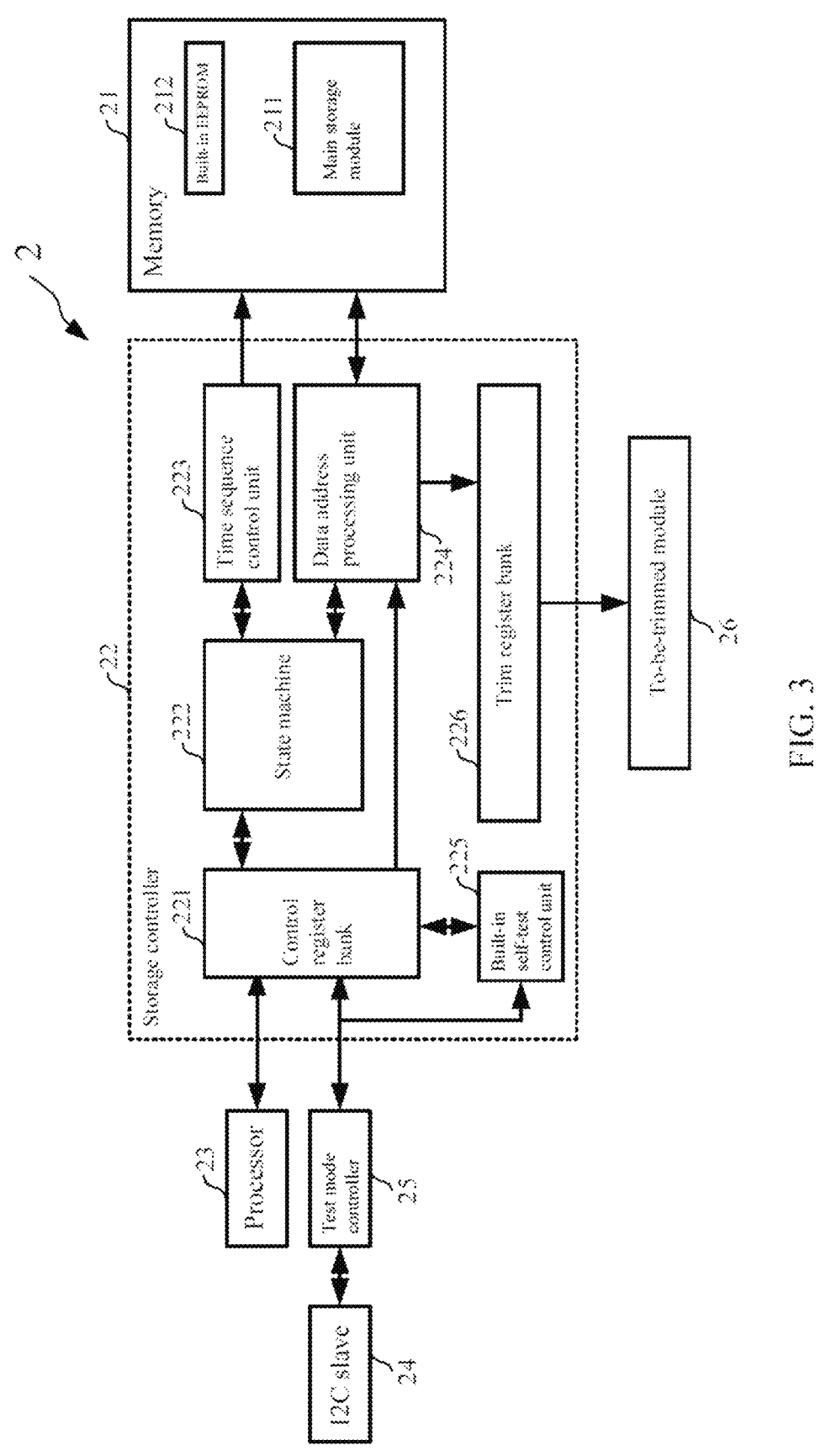
FIG. 3 is a schematic structural diagram of the memory control system according to the present disclosure.

As shown in FIG. 2 and FIG. 3, this embodiment provides a memory control system 2. The memory control system 2 includes:

a memory 21, a storage controller 22, and a processor 23.

As shown in FIG. 2 and FIG. 3, the memory 21 includes a main storage module 211 and a built-in EEPROM 212.

Specifically, an address of the memory 21 is divided into two parts. One part is used as the main storage module 211, and the other part is used as the built-in EEPROM 212. As an example, addresses 0x0000 to (0xXXXX-1) are allocated to the main storage module 211, which are used to store programs and trim values. The address 0xXXXX is later allocated to the built-in EEPROM 212 to store data.

As shown in FIG. 2 and FIG. 3, the storage controller 22 is connected to the memory 21 and the processor 23 and receives a test control signal. In a normal mode, a program in the main storage module 211 is read on the basis of an instruction of the processor 23, and read-write control is performed on the built-in EEPROM 212. In a test mode, read-write control is performed on the main storage module 211 or the built-in EEPROM 212 on the basis of configuration of the test control signal, or a self-test is completed on the basis of an instruction of the test control signal.

Specifically, as shown in FIG. 2 and FIG. 3, the storage controller 22 includes a control register bank 221, a state machine 222, a time sequence control unit 223, a data address processing unit 224, and a built-in self-test control unit 225.

More specifically, the built-in self-test control unit 225 receives the test control signal, generates a self-test configuration signal, and automatically configures the control register bank 221, thereby controlling the entire test process.

More specifically, the control register bank 221 acquires configuration instructions from the processor 23, the built-in self-test control unit 225, and the test control signal, and receives, registers, and parses the configuration instructions.

Figure 4:
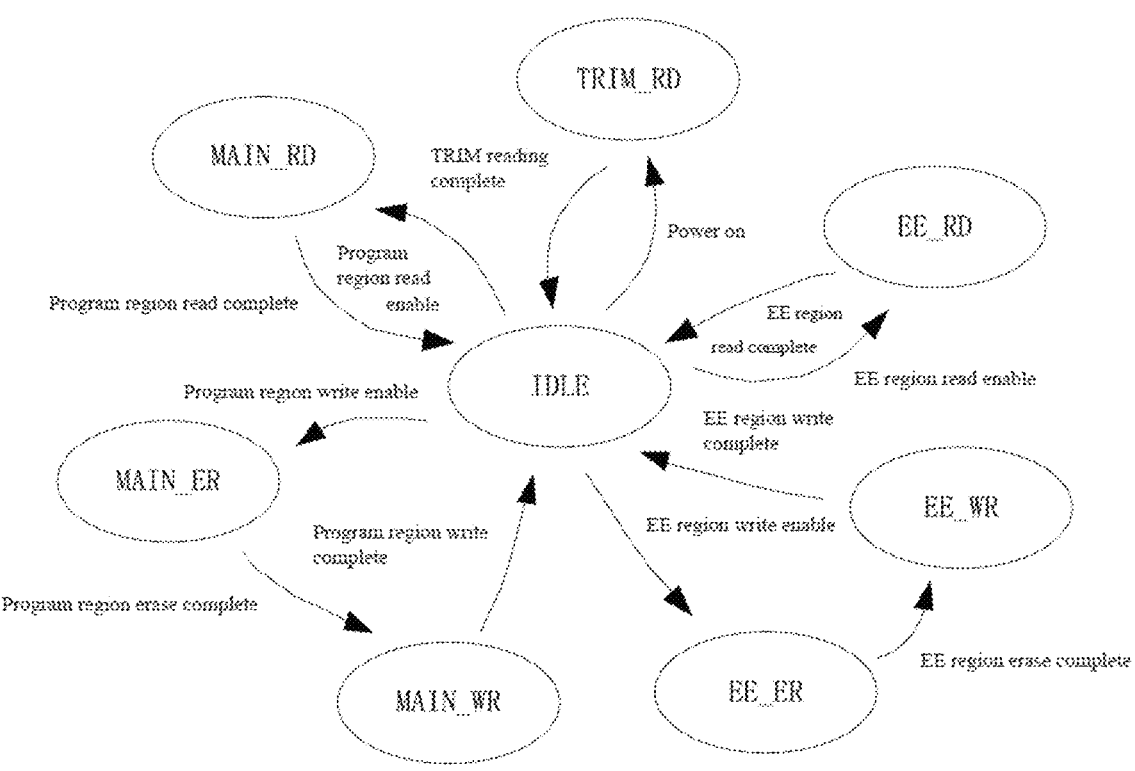
FIG. 4 is a schematic diagram of state transition of a state machine according to the present disclosure.

More specifically, the state machine 222 is connected to the control register bank 221 and controls transition of an operating state on the basis of an output signal of the control register bank 221. As an example, the state machine 222 includes 8 states: an idle state IDLE, a trim value read state TRIM_RD, a main storage module read state MAIN_RD, a main storage module write state MAIN_WR, a main storage module erase state MAIN_ER, a built-in EEPROM read state EE_RD, a built-in EEPROM write state EE_WR, and a built-in EEPROM erase state EE_ER. As shown in FIG. 4, the state machine 222 is in the idle state IDLE by default, switches to the trim value read state TRIM_RD after completion of power on, and returns to the idle state IDLE after completion of readout. After receiving a read instruction from the main storage module 211, the state machine 222 switches from the idle state IDLE to the main storage module read state MAIN_RD, and returns to the idle state IDLE after completion of readout. After receiving a read instruction from the built-in EEPROM, the state machine 222 switches from the idle state IDLE to the built-in EEPROM read state EE_RD, and returns to the idle state IDLE after completion of readout. After receiving a write instruction from the main storage module 211, the state machine 222 switches from the idle state IDLE to the main storage module erase state MAIN_ER, switches to the main storage module write state MAIN_WR after completion of erasure, and returns to the idle state IDLE after completion of writing. After receiving a write instruction from the built-in EEPROM, the state machine 222 switches from the idle state IDLE to the built-in EEPROM erase state EE_ER, switches to the built-in EEPROM write state EE_WR after completion of erasure, and returns to the idle state IDLE after completion of writing.

More specifically, the time sequence control unit 223 is connected to the state machine 222 and the memory 21 and generates, on the basis of an operating state determined by the state machine 222, a time sequence control signal satisfying operation of the memory 21. In this embodiment, the time sequence control unit 223 includes a time sequence information array and a counter. The time sequence information array includes count target values corresponding to operating states, count values corresponding to rising edges of timing signals, and count values corresponding to falling edges, which are not described in detail herein and may be set as required. The counter counts the operating states on the basis of the time sequence information array, and is reset after the count target values corresponding to the operating states are reached. As an example, an erase state and a program state (i.e., a write state) are taken as an example, as shown in the following table:

| Time sequence information array | |
|---|---|
| ERASE STATE | PROGRAM STATE |
| counter=9 | counter= 7 |
| er_rise=0__ er_fall=8__ | pg_rise=1__ pg_fall=6 |
| pep_rise=1__ pep_fall=7 | pep_rise=2__ pep_fall=5 |

Figure 5:
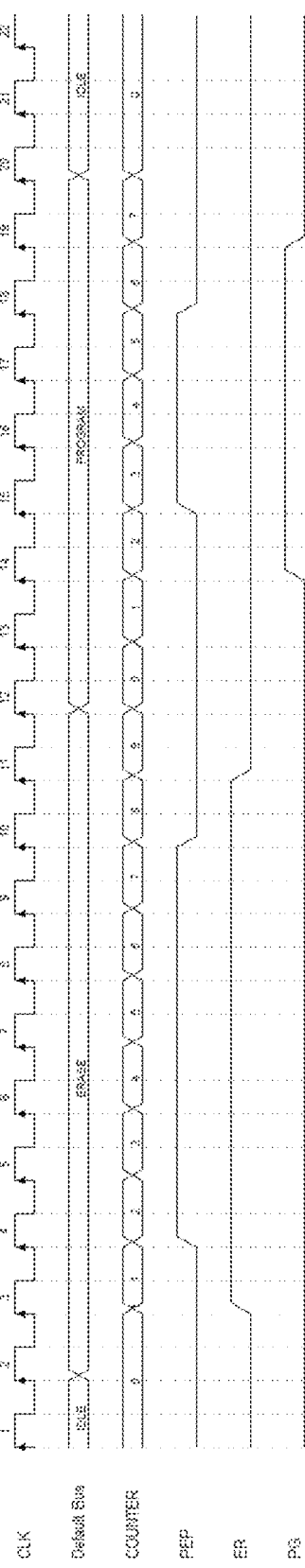
FIG. 5 is a schematic diagram of a principle of timing control according to the present disclosure.

In the erase state, the count target value counter is 9, an erased rising edge er_rise corresponds to a count value of 0, an erased falling edge er_fall corresponds to a count value of 8, a rising edge of an enable signal pep_rise corresponds to a count value of 1, and a falling edge of the enable signal pep_fall corresponds to a count value of 7. In the program state, the count target value counter is 7, a programmed rising edge pg_rise corresponds to a count value of 1, a programmed falling edge pg_fall corresponds to a count value of 6, the rising edge of the enable signal pep_rise corresponds to a count value of 2, and the falling edge of the enable signal pep_fall corresponds to a count value of 5. As shown in FIG. 5, the counter generates an erase timing signal ER, a program timing signal PG, and an enable signal PEP on the basis of the time sequence information array. In actual use, corresponding time sequence control signals may be set as required, which are not described in detail herein.

More specifically, the data address processing unit 224 is connected to the state machine 222, the control register bank 221, and the memory 21, controls an operating address of the memory 21 on the basis of the state machine 222 and the control register bank 221, and processes data read from or written to the memory 21. The structure of the data address processing unit 224 is not limited. Any circuit structure that can select a storage unit at a specified address in the memory 21 on the basis of an instruction is applicable to the present disclosure, which is not described in detail herein.

More optionally, as another implementation of the present disclosure, the storage controller 22 further includes a trim register bank 226, and the trim register bank 226 is connected to an output terminal of the data address processing unit 224, reads a trim value in the memory 21 at power on, and registers and parses the trim value. The memory control system 2 further includes a to-be-trimmed module 26, and the to-be-trimmed module 26 is connected to an output terminal of the trim register bank 226 and performs trimming on the basis of trim data outputted by the trim register bank 226.

It is to be noted that, as an example, the storage controller 22 is an embedded storage controller.

As shown in FIG. 2 and FIG. 3, the processor 23 is connected to the storage controller 22.

Specifically, in this embodiment, the processor 23 acquires a program from the memory 21 through the storage controller 22, and performs data read and write operations on the memory 21 on the basis of the program. The processor 23 includes, but is not limited to, a CPU or a MCU. Any apparatus with information processing and program running functions is suitable for the present disclosure, which is not described in detail herein.

As shown in FIG. 2 and FIG. 3, as another implementation of the present disclosure, the memory control system 2 further includes an I2C slave 24 and a test mode controller 25. The I2C slave 24 receives an I2C signal from the external I2C host. The test mode controller 25 is connected to the I2C slave 24, sets the test mode on the basis of an output signal of the I2C slave 24, and outputs the test control signal. In actual use, the test control signal may be directly inputted from the outside through a transmission line, which is not limited to this embodiment.

A memory control method implemented by the memory control system 2 is as follows.

In a normal mode, a storage controller reads a program in a main storage module on the basis of an instruction of a processor and performs read and write operations on a built-in EEPROM.

In a test mode, the storage controller performs read and write operations on the main storage module or the built-in EEPROM on the basis of configuration of a test control signal; or completes a self-test on the basis of an instruction of the test control signal.

Specifically, the memory control method further includes: reading a trim value in the main storage module after power on, entering a window period to wait after completion of reading of the trim value, and determining in the window period whether to operate in the normal mode or the test mode.

Figure 6:
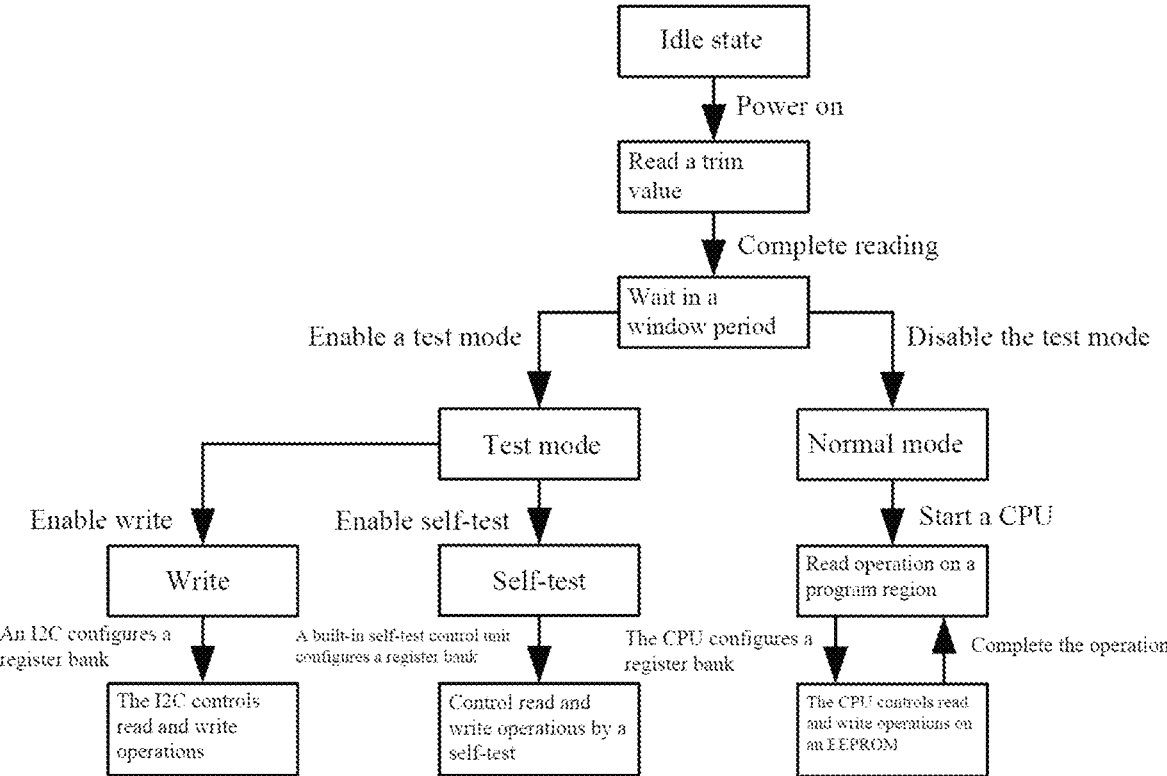
FIG. 6 is a schematic flowchart of a memory control method according to the present disclosure.

As shown in FIG. 6, an operation process of the storage controller 22 includes the following steps. The storage controller 22 is in the idle state by default, and starts reading trim data after completion of power on. After the trim data is read, the window period is entered for waiting. In the window period, an instruction may be sent through the external I2C host to enter the test mode. After the test mode is entered, an instruction may be continuously sent through the I2C to enter a writing mode or a self-test mode. In the writing mode, the control register bank 221 inside the storage controller 22 is configured by the external I2C host to complete the read and write operations on the main storage module 211 or EEPROM 212 region. In the self-test mode, the built-in self-test control unit 225 inside the storage controller 22 may automatically configure the control register bank 221 to complete the read and write operations on the main storage module 211 or EEPROM 212 region. If an instruction to enter the test mode is not received within the waiting time of the window period, the normal mode may be automatically entered. In the normal mode, the CPU may read a program stored in the main storage module 211 region, and the control register bank 221 is configured by the CPU to complete the read and write operations on the EEPROM 212 in the normal mode.

Figure 7:
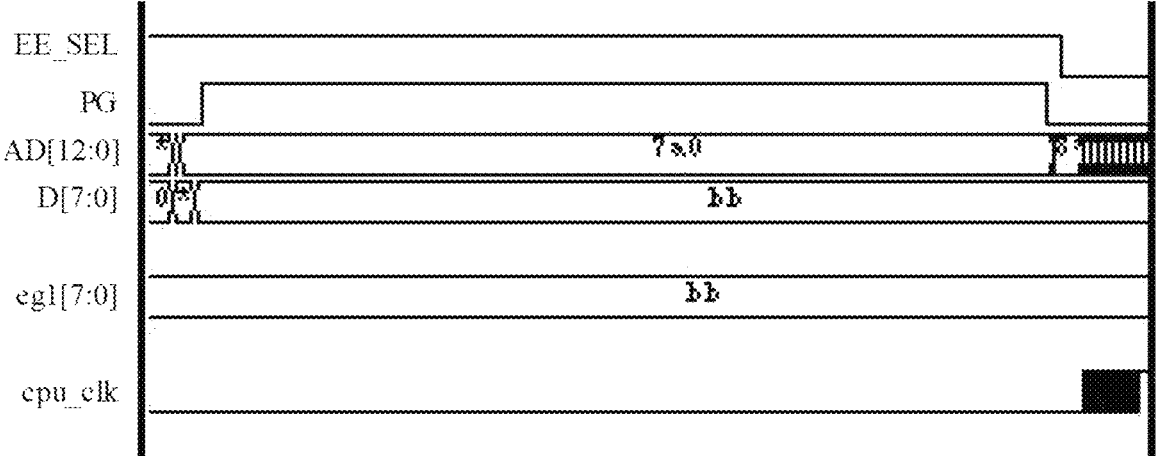
FIG. 7 is a schematic diagram of write timing of the EEPROM in a normal mode according to the present disclosure.

Specifically, in the normal mode, the write operation is performed on the built-in EEPROM 212, which is implemented in a form of register+EEPROM. The processor 23 acquires a program from the main storage module 211, runs the program to write data to the control register bank 221, and enters the dormant state after completing the configuration of the control register bank 221. A hardware circuit automatically writes the data in the control register bank 221 to the built-in EEPROM 212. After completing the write operation, the processor 23 is woken up and continues to execute the program. When the EEPROM region is operated, a port signal EE_SEL of the storage controller 21 may be automatically enabled (that is, the EEPROM region is selected), and data may be written to the EEPROM region. FIG. 7 shows write timing of the EEPROM in the normal mode. EE_SEL denotes an EEPROM selection signal, PG denotes a programming signal, AD[12:0] denotes an address signal for memory operation, D[7:0] denotes a memory input data signal, egl[7:0] denotes an external configuration register signal that determines memory input data, and cpu_clk denotes a processor clock signal. During the writing, the clock cpu_clk enters a dormant state, the EE_SEL signal is pulled up to select the EEPROM region, the write signal PG is pulled up, and 8-bit hexadecimal data bb of the register is written to the EEPROM. After completion of the writing, the EE_SEL and PG signals are pulled down, and cpu_clk is woken up to continue running the program.

Figure 8:
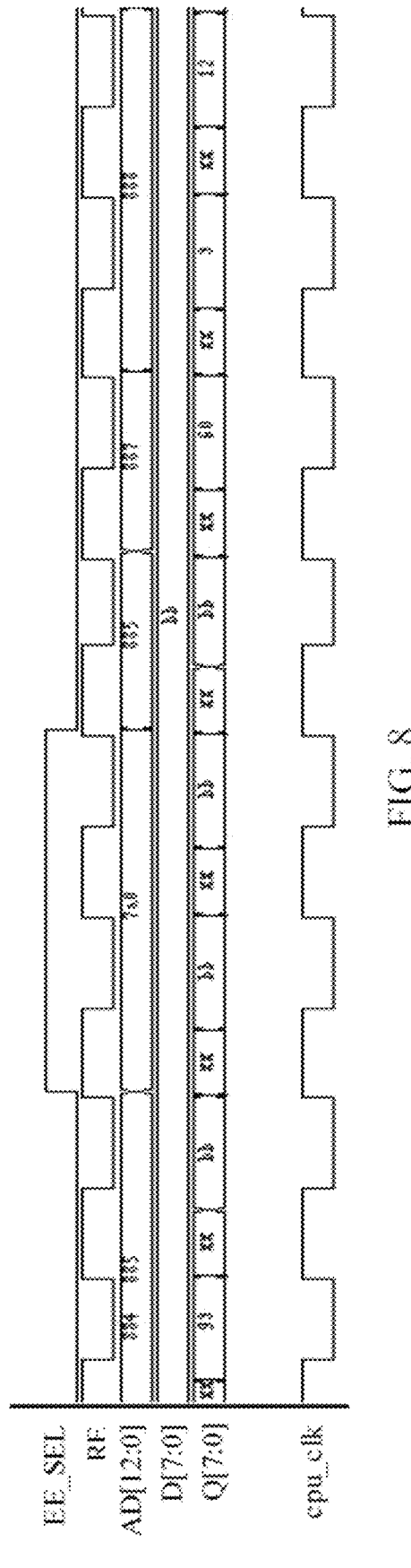
FIG. 8 is a schematic diagram of read timing of the EEPROM in the normal mode according to the present disclosure.

Specifically, in the normal mode, the read operation is performed on the built-in EEPROM 212, which is implemented by using the CPU to directly read data in the program region. The processor 23 executes a read operation program during the entire reading, and data is read from the built-in EEPROM 212 and reported to the processor 23. FIG. 8 shows read timing of the EEPROM in the normal mode. RE denotes a read signal, and Q[7:0] denotes a memory output data signal. When the EEPROM region is operated, the EE_SEL signal is pulled up, and data is read and reported to the CPU. In this process, the clock of the processor cpu_clk is not required to enter the dormant state, and the read operation can be completed in two clock cycles.

The memory control system and method according to the present disclosure are implemented on the basis of a storage controller with a built-in EEPROM, and the structure is more concise. In terms of resource usage, dependence on the RAM during the operation on the EEPROM is eliminated. At the same time, the storage controller and built-in self-test control module are designed collaboratively and integrated to maximize the reuse of logic such as the state machine, the time sequence control unit, and the data address processing unit, which effectively reduces a number of logic gates, thereby further reducing the size and power consumption of the system. The present disclosure takes the storage controller as a core. In the normal mode, the processor reads the program stored inside the main storage module, and the processor configures the control register bank to complete access to the built-in EEPROM. In the test mode, the I2C slave sends an instruction to enter the writing mode and configure the control register bank inside the storage controller to access the main storage module or EEPROM region. The I2C slave may alternatively send an instruction to enter the self-test mode to complete the self-test.

Based on the above, the present disclosure provides a memory control system and method. The system includes: a memory, a storage controller, and a processor. The memory includes a main storage module and a built-in EEPROM. The storage controller is connected to the memory and the processor and receives a test control signal, in a normal mode, reads a program in the main storage module on the basis of an instruction of the processor and performs read-write control on the built-in EEPROM; and in a test mode, performs read-write control on the main storage module or the built-in EEPROM on the basis of configuration of the test control signal, or completes a self-test on the basis of an instruction of the test control signal. In the memory control system and method according to the present disclosure, when read and write operations are performed on the EEPROM, the RAM is eliminated and replaced with a small number of registers, which greatly reduces resource consumption. When the read operation is performed on the EEPROM, data of the EEPROM is directly acquired through the processor, and dormancy and wake-up operations are not required. Therefore, logic of a hardware control reading part after dormancy is omitted and the time consumed during dormancy and wake-up is reduced, the process is simple and convenient, and the efficiency is high. Only one time sequence control unit and one counter are used to implement control of the timing of the whole system, thereby effectively reducing the size and power consumption of the whole system. Therefore, the present disclosure effectively overcomes various shortcomings in the prior art and has high industrial utilization value.

The above embodiments only illustrate the principles and effects of the present disclosure, but are not intended to limit the present disclosure. Any person skilled in the art can modify or change the above embodiments without departing from the spirit and scope of the present disclosure. Therefore, all equivalent modifications or changes made by those of ordinary skill in the art without departing from the spirit and technical ideas disclosed in the present disclosure shall still be covered by the claims of the present disclosure.

The invention claimed is:

1. A memory control system, wherein the memory control system comprises at least:
   a memory, a storage controller, and a processor;
   the memory comprising a main storage module and a built-in EEPROM; and
   the storage controller being connected to the memory and the processor and receiving a test control signal; in a normal mode, reading a program in the main storage module on the basis of an instruction of the processor and performing read-write control on the built-in EEPROM; and in a test mode, performing read-write control on the main storage module or the built-in EEPROM on the basis of configuration of the test control signal, or completing a self-test on the basis of an instruction of the test control signal;
   wherein the storage controller comprises a control register bank, a state machine, a time sequence control unit, a data address processing unit, and a built-in self-test control unit;
   the built-in self-test control unit receiving the test control signal and generating a self-test configuration signal;
   the control register bank acquiring configuration instructions from the processor, the built-in self-test control unit, and the test control signal, and receiving, registering, and parsing the configuration instructions;

the state machine being connected to the control register bank and controlling transition of an operating state on the basis of an output signal of the control register bank;

the time sequence control unit being connected to the state machine and the memory and generating, on the basis of an operating state determined by the state machine, a time sequence control signal satisfying operation of the memory; and the data address processing unit being connected to the state machine, the control register bank, and the memory, controlling an operating address of the memory on the basis of the state machine and the control register bank, and processing data read from or written to the memory.

2. The memory control system according to claim 1, wherein the storage controller further comprises a trim register bank, the trim register bank being connected to an output terminal of the data address processing unit, reading a trim value in the memory at power on, and registering and parsing the trim value.

3. The memory control system according to claim 2, wherein the state machine comprises 8 states: an idle state, a trim value read state, a main storage module read state, a main storage module write state, a main storage module erase state, a built-in EEPROM read state, a built-in EEPROM write state, and a built-in EEPROM erase state.

4. The memory control system according to claim 3, wherein the state machine is in the idle state by default, switches to the trim value read state after completion of power on, and returns to the idle state after completion of readout; after receiving a read instruction from the main storage module, the state machine switches from the idle state to the main storage module read state, and returns to the idle state after completion of readout; after receiving a read instruction from the built-in EEPROM, the state machine switches from the idle state to the built-in EEPROM read state, and returns to the idle state after completion of readout; after receiving a write instruction from the main storage module, the state machine switches from the idle state to the main storage module erase state, switches to the main storage module write state after completion of erasure, and returns to the idle state after completion of writing; and after receiving a write instruction from the built-in EEPROM, the state machine switches from the idle state to the built-in EEPROM erase state, switches to the built-in EEPROM write state after completion of erasure, and returns to the idle state after completion of writing.

5. The memory control system according to claim 3, wherein the time sequence control unit comprises a time sequence information array and a counter; the time sequence information array comprising count target values corresponding to operating states, count values corresponding to rising edges of timing signals, and count values corresponding to falling edges; the counter counting the operating states on the basis of the time sequence information array, and being reset after the count target values corresponding to the operating states are reached.

6. The memory control system according to claim 2, wherein the memory control system further comprises a to-be-trimmed module, the to-be-trimmed module being connected to an output terminal of the trim register bank and performing trimming on the basis of trim data outputted by the trim register bank.

7. The memory control system according to claim 1, wherein the processor is a central processing unit (CPU) or a micro control unit (MCU).

8. The memory control system according to claim 1, wherein the memory control system further comprises an inter-integrated circuit (I2C) slave and a test mode controller; the I2C slave receiving an external I2C signal; and the test mode controller being connected to the I2C slave, setting the test mode on the basis of an output signal of the I2C slave, and outputting the test control signal.

9. A memory control method implemented on the basis of the memory control system according to claim 1, wherein the memory control method comprises at least:

in a normal mode, a storage controller reading a program in a main storage module on the basis of an instruction of a processor and performing read and write operations on a built-in EEPROM; and in a test mode, the storage controller performing read and write operations on the main storage module or the built-in EEPROM on the basis of configuration of a test control signal; or completing a self-test on the basis of an instruction of the test control signal.

10. The memory control method according to claim 9, wherein when the write operation is performed on the built-in EEPROM in the normal mode, the processor executes the program and enters a dormant state after configuration of a control register bank, and writes data to the built-in EEPROM, and after completion of the write operation, the processor is woken up and continues to execute the program; and when the read operation is performed on the built-in EEPROM in the normal mode, the processor executes a read operation program during the entire reading, and data is read from the built-in EEPROM and reported to the processor.

11. The memory control method according to claim 9, wherein the memory control method further comprises: reading a trim value in the main storage module after power on, entering a window period to wait after completion of reading of the trim value, and determining in the window period whether to operate in the normal mode or the test mode.

* * * * *